United States Patent
Adam et al.

(10) Patent No.: US 7,495,372 B2
(45) Date of Patent: Feb. 24, 2009

(54) METHOD FOR MOUNTING A CONTACT PIN FOR A PIEZOELECTRIC ELEMENT, SLEEVE, AND ACTUATOR UNIT

(75) Inventors: Marko Adam, Chemnitz (DE); Bernhard Döllgast, Erlangen (DE); Emanuel Sanftleben, Pfatter (DE)

(73) Assignee: Siemens Aktiengesellschaft, Munich (DE)

( * ) Notice: Subject to any disclaimer, the term of this patent is extended or adjusted under 35 U.S.C. 154(b) by 52 days.

(21) Appl. No.: 10/598,655

(22) PCT Filed: Feb. 23, 2005

(86) PCT No.: PCT/EP2005/050774

§ 371 (c)(1),
(2), (4) Date: May 29, 2007

(87) PCT Pub. No.: WO2005/088744

PCT Pub. Date: Sep. 22, 2005

(65) Prior Publication Data

US 2007/0295838 A1  Dec. 27, 2007

(30) Foreign Application Priority Data

Mar. 10, 2004  (DE) ..................... 10 2004 011 697

(51) Int. Cl.
*H01L 41/08* (2006.01)
(52) U.S. Cl. .................................... 310/328
(58) Field of Classification Search ................ 310/328, 310/311; 239/533.2, 585.1, 533.3; 123/399, 123/472, 337, 361; 251/129.04
See application file for complete search history.

(56) References Cited

U.S. PATENT DOCUMENTS 5,208,506 A * 5/1993 Yamashita ................. 310/328
6,274,967 B1  8/2001 Zumstrull et al. .......... 310/328

(Continued)

FOREIGN PATENT DOCUMENTS

DE       197 15 488 C1      6/1998

(Continued)

OTHER PUBLICATIONS

International Search Report and Written Opinion for International Patent Application No. PCT/EP2005/050774 (17 pages), May 11, 2005.

*Primary Examiner*—Thomas M Dougherty
*Assistant Examiner*—Karen B Addison
(74) *Attorney, Agent, or Firm*—Baker Botts L.L.P.

(57) ABSTRACT

During the production of an actuator unit (11), which is to be installed in a fuel injector, a piezoelectric element (8) is firstly inserted into a plastic sleeve (1). Two contact pins (5) are provided for the external power supply for the piezoelectric element (8), and are guided outside the plastic sleeve (1). In order to fix the position of the contact pins (5), particularly before encapsulating the piezoelectric element (8) with the plastic sleeve (1), pin mounts (2) provided in the form of detent connections are provided for the contact pins (5). The detent connections (2) are designed for fixing the contact pins (5) in the position thereof after they have been inserted into these detent connections. In one particular embodiment, the plastic sleeve (1) is provided in the form of a one-piece hollow body so that the mounting can be effected in a particularly simple manner.

18 Claims, 4 Drawing Sheets

U.S. PATENT DOCUMENTS 6,316,863 B1 * 11/2001 Schuh et al. ................. 310/328
6,681,462 B1 * 1/2004 Frank et al. ................. 29/25.35
7,276,837 B2 * 10/2007 Boecking .................... 310/328

FOREIGN PATENT DOCUMENTS

| DE | 197 15 487 A1 | 10/1998 |
|---|---|---|
| DE | 198 18 068 | 10/1999 |
| DE | 102 29 494 A1 | 1/2004 |
| EP | 0 485 995 A1 | 5/1992 |
| WO | 98/47188 A2 | 10/1998 |
| WO | 2004/004021 A2 | 1/2004 |
| WO | 2005/035972 A1 | 4/2005 |

* cited by examiner

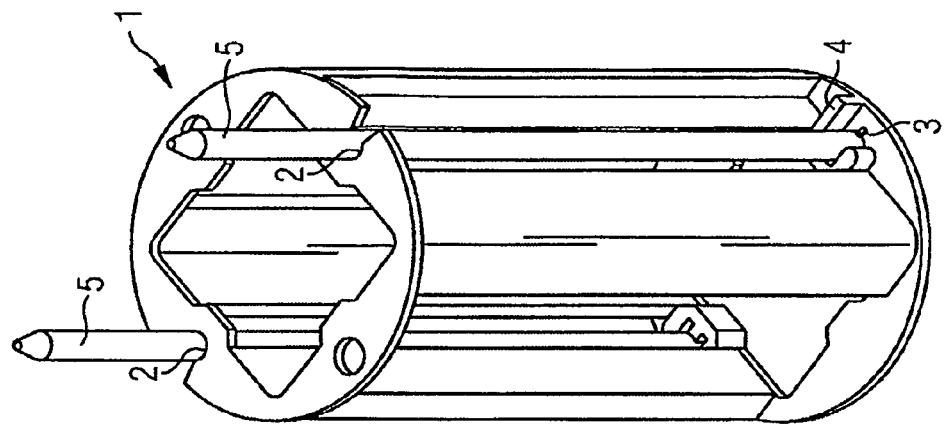
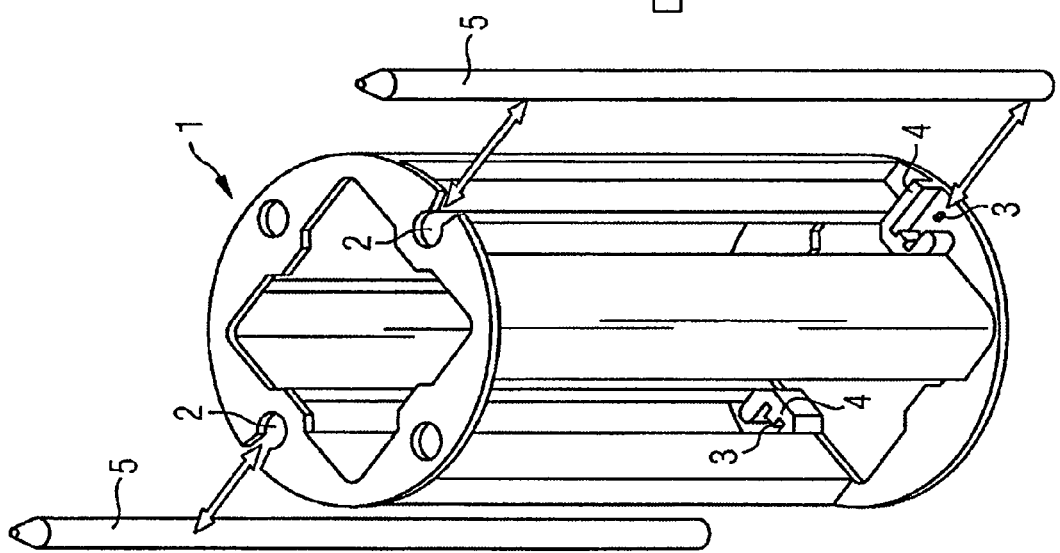

METHOD FOR MOUNTING A CONTACT PIN FOR A PIEZOELECTRIC ELEMENT, SLEEVE, AND ACTUATOR UNIT

CROSS-REFERENCE TO RELATED APPLICATIONS

This application is a U.S. national stage application of International Application No. PCT/EP2005/050774 filed Feb. 23, 2005, which designates the United States of America, and claims priority to German application number DE 10 2004 011 697.0 filed Mar. 10, 2004, the contents of which are hereby incorporated by reference in their entirety.

TECHNICAL FIELD

The invention relates to a method for mounting at least one contact pin on a sleeve, in particular a plastic sleeve, into which a piezoelectric element is inserted. A pin mount is provided on the outer circumference at the upper and/or lower end of the sleeve for the contact pin. In this situation, the contact pin is connected electrically by way of one or more contact wires to the piezoelectric element. In addition, the invention relates to a sleeve for accommodating a piezoelectric element which is mounted inside the sleeve. On the outer circumference of the sleeve, two contact pins lying opposite one another which are connected electrically to the piezoelectric element by means of contact wires are arranged parallel to the longitudinal axis of the sleeve. Furthermore, the invention relates to a piezoelectric actuator which can be used for controlling a valve unit that is located in a fuel injector.

BACKGROUND

With this arrangement of the contact pins at the outer edge of the sleeve the problem exists of fixing the contact pins as securely as possible in order that they do not change their position during subsequent encapsulation of the sleeve and the inserted piezoelectric element with silicone or a similar material. Precise adherence to a predefined position is however absolutely essential in order that the upper contact surfaces of the contact pins are easily accessible for the connection of an electrical control unit after the installation of the actuator unit into the fuel injector. It is also necessary to ensure that the connecting parts still have a sufficiently large insulating gap with respect to adjacent metal parts because a relatively high control voltage is applied to the actuator. A further difficulty also consists in the fact that the mounting of the contact pins, to which the contact wires for the piezoelectric element are already soldered, is somewhat laborious because the contact pins are held only very loosely in the holes provided and can therefore easily slip when the parts are joined together.

Up until now these problems have only been inadequately solved. For example, for manufacturing related reasons a two-part plastic sleeve which has been turned over the piezoelectric element at the top and bottom has been used. When the two sleeve parts are joined together the sleeve is mechanically relatively unstable, and in particular the two contact pins can only be positioned very imprecisely. In addition, the engineering effort required for assembly is increased. Also, the two contact pins are inserted at the outer edge of the plastic sleeve into holes which are located on the upper end face of the plastic sleeve. With regard to this type of mounting, the contact pins are arranged to be relatively moveable, with the result that their position can easily change during encapsulation. This can then result in positioning errors affecting the contact pins in the finished encapsulated actuator unit, errors which can no longer be corrected. In the worst case the actuator unit can then not be used and must be singled out.

SUMMARY

The object of the invention is to fix the contact pins in their position in a simple manner at the outer edge of the sleeve and thereby to simplify the assembly of the actuator unit. This object can be achieved by a method for mounting at least one contact pin on a sleeve into which a piezoelectric element is inserted, comprising the steps of providing at least one pin mount on the outer circumference at the upper and/or lower end of the sleeve for the contact pin, and connecting the contact pin electrically by way of one or more contact wires to the piezoelectric element, wherein the pin mount is provided in the form of a detent connection, and the detent connection is implemented such that the contact pin is fixed in its position after insertion into the detent connection.

An upper pin mount can be provided on the outer edge of the sleeve and the upper pin mount may have a wedge-shaped insertion aid by means of which the contact pin can be inserted sideways into the pin mount to lock into position. A lower pin mount may have a support and the support secures the contact pin against pressure from above. A lower pin mount may have a guide aid by means of which the contact pin can be inserted sideways into the sleeve. A lower pin mount may have an arresting element, which preferably takes the form of a burl and thereby prevents the lower end of the contact pin from falling out of the guide aid. The detent connection for the contact pin can be designed to be releasable. The detent connection for the contact pin can be designed to be non-releasable.

The object can also be achieved by a sleeve for accommodating a piezoelectric element, wherein the piezoelectric element is mounted inside the sleeve, and two contact pins lying opposite one another are arranged on the outer circumference of the sleeve parallel to the longitudinal axis in respective pin mounts, wherein the contact pins are connected electrically by means of a plurality of contact wires to a piezoelectric element situated in the sleeve, wherein the sleeve has two pin mounts at its upper and its lower end faces, respectively for fixing the two contact pins and the pin mounts take the form of detent connections.

The detent connections of the sleeve may have a wedge-shaped insertion aid and/or guide aid by means of which the contact pin can be inserted sideways. The sleeve can be designed as a single part and as a plastic sleeve.

Furthermore, the object can also be achieved by a piezoelectric actuator for controlling a valve unit of a fuel injector, wherein the piezoelectric actuator has a piezoelectric element which is surrounded by a plastic sleeve, the piezoelectric element is connected by way of contact wires to two contact pins which are arranged at the outer edge of the plastic sleeve, and wherein the plastic sleeve is formed as a one-piece hollow body and that on an upper and a lower end face the plastic sleeve has integrated detent connections by means of which the contact pins are fixed in their position.

With regard to the method according to the invention for mounting at least one contact pin on a sleeve, in which a piezoelectric element has been inserted or with regard to the sleeve and the piezoelectric actuator, the advantage results that the at least one contact pin is accommodated by a pin mount which is provided in the form of a detent connection. Through the detent connection, the contact pin finds a secure support and is thus fixed in a simple manner to prevent movement in the axial or radial direction. In this situation, it is considered to be particularly advantageous that the contact pin can be clipped in sideways. This considerably facilitates the insertion of the contact pin since the contact pin as a rule has a large number of thin contact wires soldered to it which are connected at their other end to the piezoelectric element. These contact wires are extremely sensitive and can easily break if not handled with care.

With regard to the piezoelectric actuator, it appears to be particularly advantageous for the sleeve to be in the form of a single part. It can for example be easily manufactured with appropriate strength using an injection molding process. The sleeve is thus dimensionally stable and easy to handle, such that the contact pins can be securely fixed in the detent connections.

A particularly favorable solution can be seen to consist in the fact that an upper pin mount which has an insertion aid is provided on the outer edge of the sleeve. This insertion aid is wedge-shaped in form, such that the contact pin can be inserted sideways and locked in position in a very simple manner. By means of the locking, the contact pin is fixed particularly securely in its position.

Also, it can be considered to be advantageous that a support is provided in the case of a lower pin mount, by means of which the contact pin is secured against pressure from above. At the same time, the support advantageously serves to provide insulation against metal parts situated beneath it.

A guide aid is provided in order to also achieve easy insertion of the contact pin at the lower pin mount. By this means, the contact pin can be inserted sideways and located in a similar manner to the case of the upper pin mount. This facilitates the mounting of the contact pin, particularly when the contact pin is already connected to the many contact wires.

In a preferred embodiment, an arresting element is additionally provided at the lower pin mount. The arresting element preferably takes the form of a burl and thus prevents the contact pin from being able to slip out of the arresting element at its lower end.

The arresting elements for the contact pin take the form of releasable or alternatively non-releasable detent connections. As a result, the sleeve is suitable for universal use for different applications; in particular it also allows repairs to be attempted.

BRIEF DESCRIPTION OF THE DRAWINGS

An embodiment of the invention is illustrated in the drawing and will be described in detail in the following.

FIG. 3 shows a spatial representation of how to secure two contact pins to the sleeve, FIG. 4 shows a spatial representation of the sleeve with the two located contact pins.

DETAILED DESCRIPTION

Figure 1:
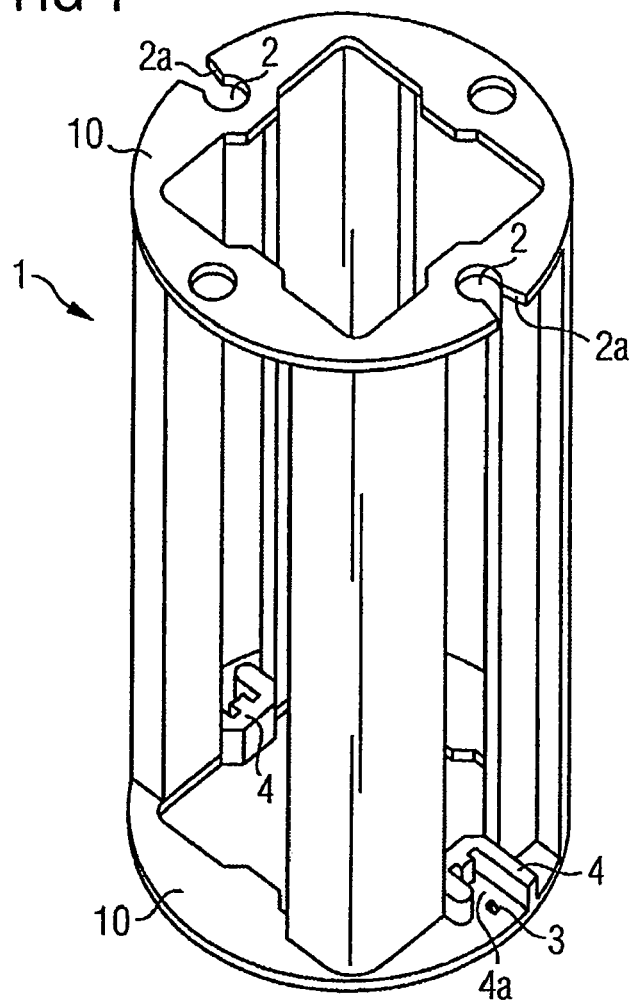
FIG. 1 shows a three-dimensional representation of a one-part sleeve according to the invention.

According to an embodiment of the invention, FIG. 1 shows a three-dimensional representation of a sleeve 1 which is formed as a mounting sleeve to accommodate an appropriately designed piezoelectric element, as will be described later in more detail. The sleeve 1 is preferably manufactured from an insulating plastic, using an injection molding process. As can also be seen from FIG. 1, the sleeve 1 is formed as a single part such that it can be manufactured with appropriate accuracy of fit and dimensional stability. At the two opposite end faces 10 of the sleeve 1 square-shaped cutouts are provided which serve to accommodate the piezoelectric element. In addition, the sleeve 1 has two side openings opposite one another. These openings are of such a size that the piezoelectric element can be pushed through them. At the upper end face 10, two holes opposite one another are located at the outer edge of the sleeve 1 which serve as pin mounts 2 for the contact pins. The pin mounts 2 have wedge-shaped insertion aids 2a directed towards the outer edge of the end face 10, through which the contact pins can be inserted more easily into the pin mounts 2. The pin mounts 2 are implemented as detent connections in respect of their diameter and the wedge-shaped insertion aids 2a, and ensure that the contact pins are securely fixed in their position after being inserted. The two pin mounts 2 are preferably situated in an area of the sleeve 1 at which no side openings are provided.

If the contact pins are designed as having different diameters—for example in order to make it possible to differentiate the polarities for the power supply—then the detent connections 2 are also proportioned accordingly. In addition, the contact pins can be designed to have constrictions or a bulge in the area of the detent connections in order to prevent any vertical displacement of the contact pins.

Two further pin mounts 2 matching the two upper pin mounts are provided at the lower end face 10 of the sleeve 1. These two pin mounts 2 are sprayed onto the inside of the end face 10 as a raised contour. They are formed such that they are open towards the outside and form a guide aid 4 for the contact pins being inserted. At the opening of the two guide aids 4 an arresting element 3 is provided which in the simplest case takes the form of a raised contour (burl). It is preferably designed to be wedge-shaped in order to enable the contact pin to engage easily but to prevent it from falling out.

The detent connections 2 described above can be designed such that they are releasable—or in an alternative embodiment of the invention are not releasable.

Further holes can for example be provided on the sleeve 1 which can be used for securing further parts, a Bourdon tube for example.

Figure 2:
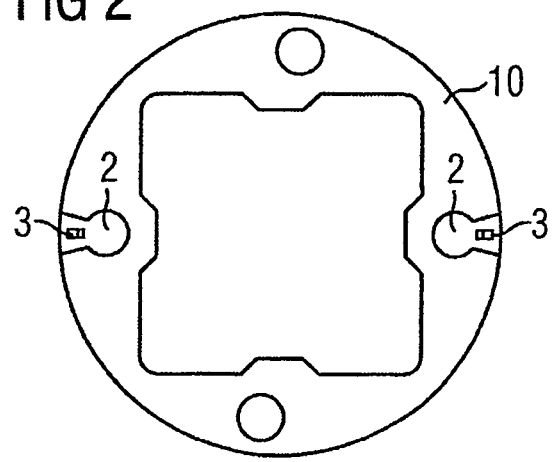
FIG. 2 shows a top view of the sleeve illustrated in FIG. 1.

FIG. 2 shows a top view of the sleeve 1 described above. The square-shaped opening situated in the center of the end face 10 for accommodating the piezoelectric element can be seen. Two detent connections 2 situated opposite one another to the left and right can be seen at the outer circumference in FIG. 2. In addition, the arresting elements 3 which are fitted on the lower end face 10 can be seen. It should also be mentioned that the sleeve 1 illustrated is not drawn to scale.

The two FIGS. 3 and 4 show how the contact pins 5 are located and mounted on the sleeve 1. In the simplest case the two contact pins 5 are implemented as pins (metal pins), tubing or the like and are—as illustrated by the two arrows in FIG. 3—inserted into the pin mounts or detent connections 2 from the side and clipped in and locked in position here such that its position is fixed relative to the sleeve 1. In this situation, the two contact pins 5 are inserted such that their lower end lies on the lower end face 10 and is fixed by the arresting element 3. The mounting of the contact pins 5, to which the contact wires and the piezoelectric element have already been soldered, will be described in more detail in the following.

FIG. 4 illustrates the two contact pins 5 in the mounted state. This illustration has been simplified for reasons of clarity. In practice, the two contact pins 5 will previously have had a large number of contact wires soldered to them which establish the electrical connections with the piezoelectric element. The wired-up piezoelectric element must therefore be inserted in the sleeve 1 at the same time together with the two contact pins 5. In this situation, the piezoelectric element is pushed in together with one contact pin through one of the two side openings such that it finds space in the square-shaped cutout. Here the one contact pin is pushed right through. When the piezoelectric element is situated in the desired position, then the contact wires are fed around the sleeve 1 such that the two contact pins 5 can be clipped into the provided detent connections 2.

Figure 5:
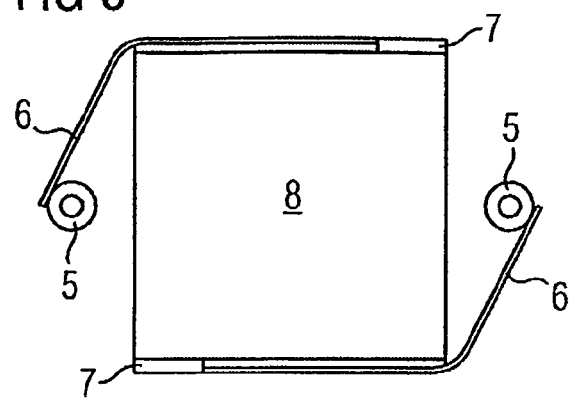
FIG. 5 shows a top view of a piezoelectric element with contact wires which are connected to the two contact pins.
Figure 6:
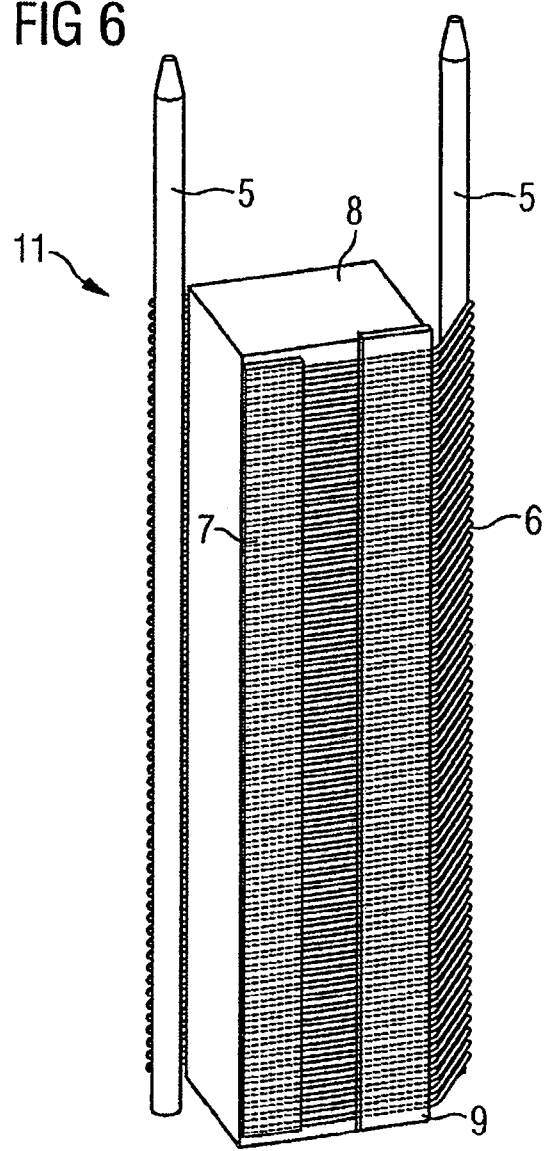
FIG. 6 shows a three-dimensional representation of the piezoelectric element with the two wired contact pins and FIG. 7 shows a three-dimensional representation of the one-part sleeve with the mounted piezoelectric element, two contact pins and the contact wires prior to encapsulation.

FIG. 5 shows a top view of a piezoelectric element 8. The piezoelectric element 8 is made up of a combination of a large number of individual piezoceramic disks in the form of a cuboid as a so-called piezo stack. At each of two opposite edges of the piezoelectric element 8 is fitted an electrode 7, which electrodes are electrically connected with the individual disks of the piezo stack. The two contact pins 5 can be seen in cross-section to the right and left of the piezoelectric element 8. The contact wires 6 are wound between an electrode 7 and a contact pin 5. In this situation, the contact wires 6 are fed around a corner of the piezoelectric element 8. In order to avoid an electrical short-circuit with the piezoelectric element 8, an edge protector 9 is provided in each case, as can be seen in FIG. 6. The many contact wires 6 are provided in order to prevent an interruption of the electrical circuit in the event of a breakage among the electrodes 7 which are subjected to extremely high stress levels on account of the constant changes of length affecting the piezoelectric element 8.

FIG. 6 shows a three-dimensional illustration of the actuator unit 11 with the contact pins 5, the edge protector 9 and the contact wires 6. In this form, the contact pins 5 are connected flexibly by way of the contact wires 6 to the piezoelectric element 8.

Figure 7:
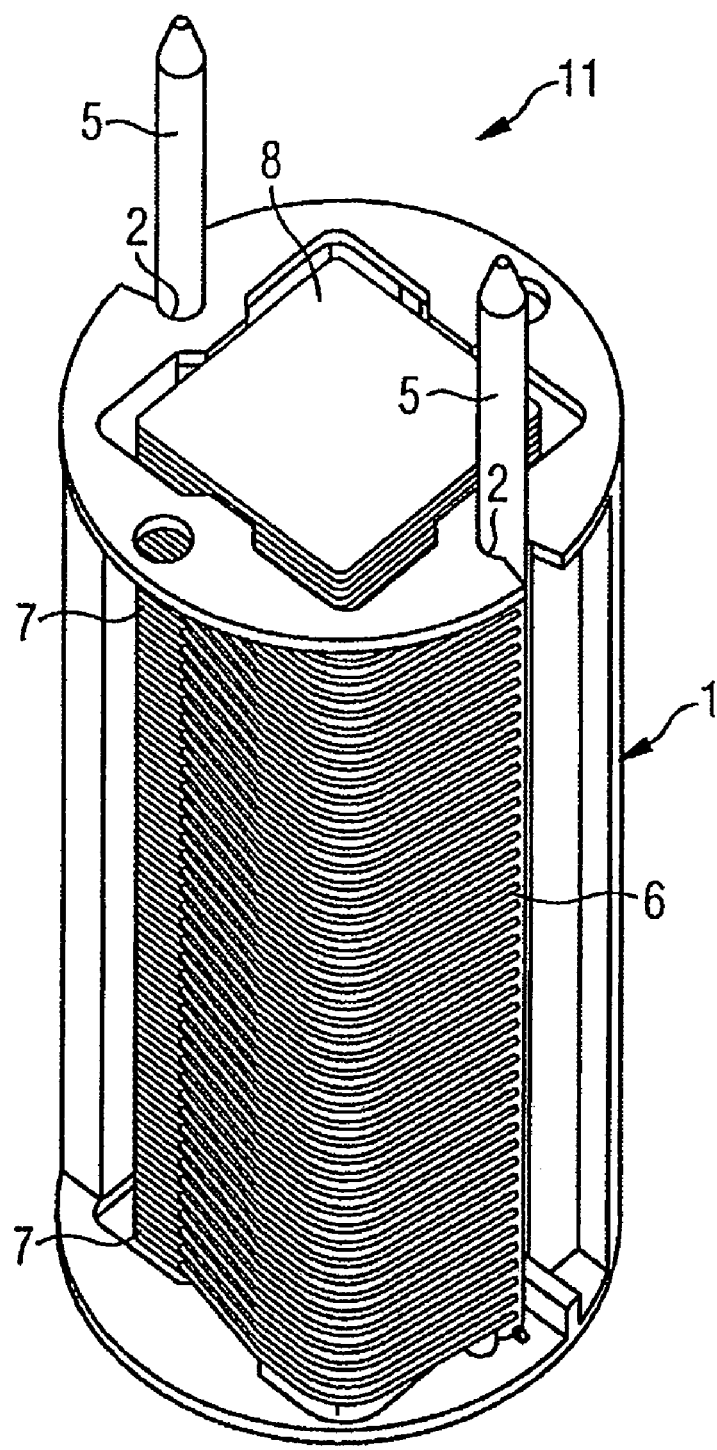

FIG. 7 shows a piezoelectric actuator, assembled as a complete actuator unit 11. With regard to the actuator unit 11, the piezoelectric element 8 has been inserted into the one-part sleeve 1, as described above. In addition, the two contact pins 5 are clipped into the detent connections 2. The upper freestanding ends of the two contact pins 5 are used for the subsequent electrical connection to the control unit. The many contact wires 6 which are soldered onto the electrode 7 at the corresponding soldering surfaces can also be seen. In this state, the piezoelectric actuator 11 completely prepared for the encapsulation process.

What is claimed is:

1. A method for mounting at least one contact pin on a sleeve into which a piezoelectric element is inserted, comprising the steps of:
   providing at least one pin mount on the outer circumference at the upper and/or lower end of the sleeve for the contact pin, and
   connecting the contact pin electrically by way of one or more contact wires to the piezoelectric element, wherein the pin mount is provided in the form of a detent connection, and the detent connection is implemented such that the contact pin is fixed in its position after insertion into the detent connection.

2. A method according to claim 1, wherein an upper pin mount is provided on the outer edge of the sleeve and the upper pin mount has a wedge-shaped insertion aid by means of which the contact pin can be inserted sideways into the pin mount to lock into position.

3. A method according to claim 1, wherein a lower pin mount has a support and the support secures the contact pin against pressure from above.

4. A method according to claim 1, wherein a lower pin mount has a guide aid by means of which the contact pin can be inserted sideways into the sleeve.

5. A method according to claim 1, wherein a lower pin mount has an arresting element, which preferably takes the form of a burl and thereby prevents the lower end of the contact pin from falling out of the guide aid.

6. A method according to claim 1, wherein the detent connection for the contact pin is designed to be releasable.

7. A method according to claim 1, wherein the detent connection for the contact pin is designed to be non-releasable.

8. A sleeve for accommodating a piezoelectric element, wherein the piezoelectric element is mounted inside the sleeve, and two contact pins lying opposite one another are arranged on the outer circumference of the sleeve parallel to the longitudinal axis in respective pin mounts, wherein the contact pins are connected electrically by means of a plurality of contact wires to a piezoelectric element situated in the sleeve, wherein the sleeve has two pin mounts at its upper and its lower end faces, respectively for fixing the two contact pins and the pin mounts take the form of detent connections.

9. A sleeve according to claim 8, wherein the detent connections of the sleeve have a wedge-shaped insertion aid and/or guide aid by means of which the contact pin can be inserted sideways.

10. A sleeve according to claim 8, wherein the sleeve is designed as a single part and as a plastic sleeve.

11. A piezoelectric actuator for controlling a valve unit of a fuel injector, wherein the piezoelectric actuator has a piezoelectric element which is surrounded by a plastic sleeve, the piezoelectric element is connected by way of contact wires to two contact pins which are arranged at the outer edge of the plastic sleeve, and wherein the plastic sleeve is formed as a one-piece hollow body and that on an upper and a lower end face the plastic sleeve has integrated detent connections by means of which the contact pins are fixed in their position.

12. A piezoelectric actuator according to claim 11, wherein an upper pin mount is provided on the outer edge of the sleeve and the upper pin mount has a wedge-shaped insertion aid by means of which the contact pin can be inserted sideways into the pin mount to lock into position.

13. A piezoelectric actuator according to claim 11, wherein a lower pin mount has a support and the support secures the contact pin against pressure from above.

14. A piezoelectric actuator according to claim 11, wherein a lower pin mount has a guide aid by means of which the contact pin can be inserted sideways into the sleeve.

15. A piezoelectric actuator according to claim 11, wherein a lower pin mount has an arresting element, which preferably takes the form of a burl and thereby prevents the lower end of the contact pin from falling out of the guide aid.

16. A piezoelectric actuator according to claim 11, wherein the detent connection for the contact pin is designed to be releasable.

17. A method according to claim 1, wherein the detent connections for the contact pin are designed to be non-releasable.

18. A method according to claim 1, wherein, the sleeve is a plastic sleeve.

* * * * *